United States Patent
Prasad Chennupati

(10) Patent No.: US 10,006,946 B2
(45) Date of Patent: Jun. 26, 2018

(54) FAULT CURRENT DETECTION WITH AN INTEGRATED MAGNETIC SENSOR ARRAY

(71) Applicant: TEXAS INSTRUMENTS INCORPORATED, Dallas, TX (US)

(72) Inventor: Siva RaghuRam Prasad Chennupati, Unterschleißheim (DE)

(73) Assignee: Texas Instruments Incorporated, Dallas, TX (US)

( * ) Notice: Subject to any disclaimer, the term of this patent is extended or adjusted under 35 U.S.C. 154(b) by 795 days.

(21) Appl. No.: 14/290,067

(22) Filed: May 29, 2014

(65) Prior Publication Data

US 2015/0323585 A1 Nov. 12, 2015

Related U.S. Application Data

(60) Provisional application No. 61/989,934, filed on May 7, 2014.

(51) Int. Cl.
| | |
|---|---|
| *G01R 31/08* | (2006.01) |
| *G01R 31/02* | (2006.01) |
| *G01R 19/10* | (2006.01) |
| *H02H 3/32* | (2006.01) |
| *H02H 1/00* | (2006.01) |
| *G01R 15/20* | (2006.01) |

(52) U.S. Cl.
CPC ............ *G01R 19/10* (2013.01); *G01R 31/025* (2013.01); *G01R 31/08* (2013.01); *H02H 1/0007* (2013.01); *H02H 3/32* (2013.01); *G01R 15/207* (2013.01)

(58) Field of Classification Search
None
See application file for complete search history.

(56) References Cited

U.S. PATENT DOCUMENTS

| | | | | |
|---|---|---|---|---|
| 2005/0030018 | A1* | 2/2005 | Shibahara | G01R 15/20 324/251 |
| 2006/0012459 | A1* | 1/2006 | Lenssen | G01R 15/205 338/32 R |
| 2010/0134077 | A1* | 6/2010 | Krajcovic | H02J 1/14 323/234 |
| 2013/0265036 | A1* | 10/2013 | Friedrich | G01R 33/0094 324/207.2 |

OTHER PUBLICATIONS

Kawahito, S. et al., "A Digital Fluxgate Magnetic Sensor Using Sigma-Delta Modulation for Weak Magnetic Field Measurement", Instrumentation and Measurement Technology Conference, 2002. IMTC/2002. Proceedings of the 19th IEEE, vol. 1, Publication Year: 2002, pp. 257-260.

* cited by examiner

*Primary Examiner* — Jermele M Hollington
*Assistant Examiner* — Suresh K Rajaputra

(57) ABSTRACT

A system is provided, comprising: a magnet flux sensor; a first conductor proximate to the magnetic field sensor; a current controller coupled to the first wire; a second conductor proximate to the magnetic field sensor; wherein the first current controller and the second current controller ensure that current do not travel in opposite directions.

20 Claims, 8 Drawing Sheets

RING FLUXGATE (INSIDE)
WITH COMPENSATION COIL

BOARD BACK SIDE
DRV411 ON TOP CORNER

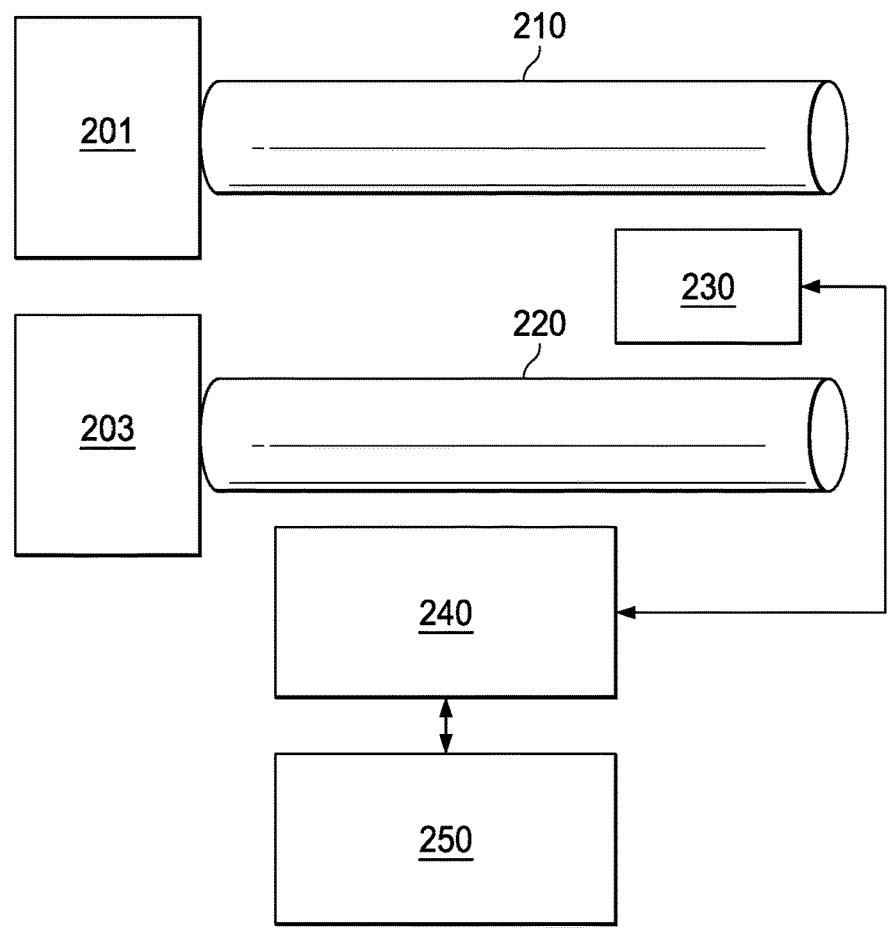

FIG. 2C

| | CURRENT IN SAME DIRECTION (THIS DISCLOSURE) | CURRENT IN OPPOSITE DIRECTION (PRIOR ART) |
|---|---|---|
| FIELD AT CENTER OF TWO CONDUCTORS | ZERO/LOW - DEPENDS ON FAULT CURRENT (WITHOUT CONCENTRATOR) | LARGE/2x - DEPENDS ON COMMON MODE CURRENT |
| FIELD AROUND TWO CONDUCTORS | LARGE/2x - DEPENDS ON COMMON MODE CURRENT | ZERO/LOW - DEPENDS ON FAULT CURRENT (CONCENTRATOR MUST) |
| FIELD TYPE | DIFFERENTIAL FIELD @ CENTER | SINGLE ENDED FIELD @ ANY POINT |

FIG. 2Di

| | CURRENT IN SAME DIRECTION (THIS DISCLOSURE) | CURRENT IN OPPOSITE DIRECTION (PRIOR ART) |
|---|---|---|
| STRAY FIELD REJECTION | DIFFERENTIAL MEASUREMENT REJECTS STRAY FIELDS (DIFFERENTIAL) | CLOSED CONCENTRATOR REQUIRED, CHIP SLOT MAKES IT WORST (SINGLE ENDED) |
| COMMON MODE REJECTION | NO CONCENTRATOR REQUIRED FOR FIELD SUMMATION | THICK CLOSED CONCENTRATOR REQUIRED FOR FIELD SUMMATION |
| DEGAUSS AFTER FAULT | NO CORE - NO DEGAUSS! | DEGAUSS IS REQUIRED - COIL AROUND CORE IS REQUIRED |
| SNR AND GAIN | SMALL SIGNAL REQUIRES VERY GOOD SNR AND GAIN | LARGE SIGNAL REQUIRES MODERATE SNR AND GAIN |

FIG. 2Dii

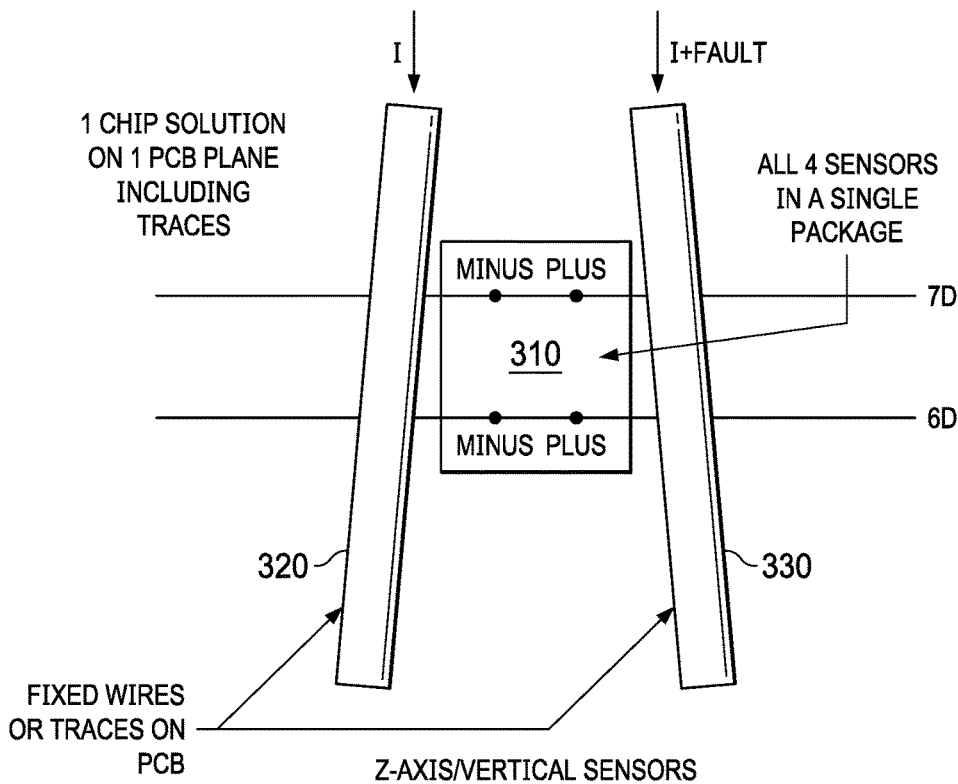

FIG. 3

SIMULATION RESULTS (MAXWELL 3D)
ARITHMETIC COMBINATION OF VECTOR FIELDS IN 7D AND 6D PLANES GIVES THE FAULT CURRENT DETECTION POSSIBILITY

| | 7D (ARITHMETIC) 6D | | | | |
|---|---|---|---|---|---|
| I[A] | H_x [uT] - Fault='0A' | H_x [uT] - Fault='0.01A' | H_x [uT] - Fault='0.02A' | H_x [uT] - Fault='0.03A' | H_x [uT] - Fault='1A' |
| 0 | 0 | -1.090923664 | -2.181847327 | -3.272771017 | -109.0923659 |
| 0.1 | -0.005030365 | -1.095962663 | -2.186945484 | -3.277887192 | -109.0982099 |
| 1 | -0.050303184 | -1.141261918 | -2.23213991 | -3.32310362 | -109.1440593 |
| 10 | -0.503027895 | -1.593992063 | -2.684935231 | -3.775991269 | -109.5962576 |
| 100 | -5.030298733 | -6.121278876 | -7.212209453 | -8.303170851 | -114.1261971 |

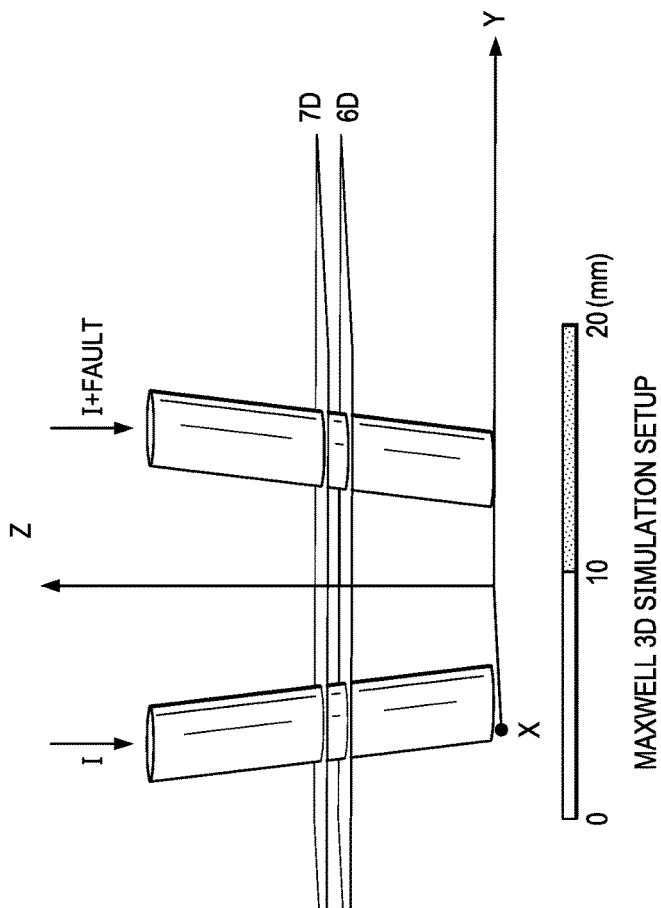

SUMMARY:
- FIRST STIMULATION RESULTS ARE VERY PROMISING
- CAPABLE OF MEASURING DOWN TO 10mA FAULT CURRENT
- COMMON MODE REJECTION IS REQUIRED >20A -(CAN BE USED OVER CURRENT TRIP FEATURE>20A)

FIG. 5

FAULT CURRENT DETECTION WITH AN INTEGRATED MAGNETIC SENSOR ARRAY

This application claims the benefit of Provisional Application No. 61/989,934, filed May 7, 2014, the entirety of which is hereby incorporated by reference.

BACKGROUND

This Application is directed, in general, to fault current protection and, more specifically, to fault detection with a use of an array of magnetic sensor, such as an integrated magnetic sensors.

Residential mains installations are required by regulations to be equipped with residual (fault) current detectors. These detectors detect the presence of a leakage path (insulation fault or human body) by assessing the difference of live and neutral wire currents. When that difference exceeds a threshold, e.g. 30 mA, a relay is opened to protect the installation or human touching a live conductor. It is also anticipated that white goods will be required to be equipped with such protection, also for emerging markets, where the earthing rules may not be always observed. Generally, protection may need to be integrated in the mains plug, to also detect faults in the mains cable itself.

Generally, the prior art produces a difference in a magnetic domain, by passing live and return (neutral) currents through wires wound on the same magnetic core. In case of a fault, the difference in magnetic flux will pass a 3rd coil and drive a normally-closed relay directly or will be detected by a magnetic sensor, e.g. a Hall sensor, to drive a relay.

Generally, when a leakage current occurs, this will affect the magnetic field around the current carrying conductor. This magnetic field can be compared with, for example, an 'ideal' magnetic field, or with a magnetic field of a second conductor. This can be done with an flux sensor (IFG), such as discussed "A Digital Fluxgate Magnetic Sensor Using Sigma-Delta Modulation for Weak Magnetic Field Measurement" by S. Kawahito, et al, EEEE International Instruments and Measurements Technology Conference, pages 257-260, May 2002.

FIG. 1A illustrates a prior art approach of measuring a magnetic field with an Flux Gate sensor. In FIG. 1A, the sum of the field around the two conductors is zero when perfectly matched. Therefore, this field around the conductors needs a concentrator to measure any slight but nonetheless important variation. The field between the conductors is large, double that of each individual conductor.

FIG. 1B illustrates a prior art fluxgate sensor and concentrator. As is illustrated, the current is flowing in opposite directions, which requires a concentrator 110 to concentrate the magnetic field of the two conductors 120, 125. A magnetic field sensor can be placed in the slot of the concentrator 110 for sensing the fault current.

FIG. 1C illustrates a prior art current sensor module, the magnetic field sensor is a Fluxgate sensor in a circular ring form. The flux gate sensor is surrounded by 2 magnetic shields or concentrators for isolation and field concentration or common mode field reduction.

Therefore, there is a need in the art as understood by the present inventors for improved approach to sensing fault currents.

SUMMARY

A first aspect provides a system, comprising: a magnet flux sensor; a first conductor proximate to the magnetic field sensor; a current controller coupled to the first wire; a second conductor proximate to the magnetic field sensor; wherein the first current controller and the second current controller ensure that current do not travel in opposite directions.

A second aspect provides a system comprising: an integrated magnetic flux sensor; a first conductor proximate to the magnetic field sensor; a current controller coupled to the first wire; a second conductor proximate to the magnetic field sensor; wherein the first current controller and the second current controller ensure that current do not travel in opposite directions; a printed circuit board; and wherein the integrated magnetic flux sensor, the first current controller, and the second current controller are each in, and/or coupled to the printed circuit board.

A third aspect provides an apparatus, comprising: a first magnetic flux sensor; a second magnetic flux gate sensor a first conductor proximate to the first and second magnetic flux sensors; a current controller coupled to the first wire; a second conductor proximate the first and second magnetic flux sensors; wherein the first current controller and the second current controller ensure that currents do not travel in opposite directions, wherein each of the first and second conductors includes an L shape; and wherein the first and second traces are at least in part mirror images of one another.

BRIEF DESCRIPTION OF THE DRAWINGS

Reference is now made to the following descriptions:

FIG. 2C illustrates a block diagram of a current sensor using an integrated sensor array;

FIG. 2Di illustrates an overview of the two approaches of the principles of the present application, and of the Prior Art;

FIG. 2Dii discusses further aspects of two approaches of the principles of the present application, and of the Prior Art;

FIG. 3 illustrates another aspect of sensor array 310 that is used to measure current with conductors;

FIG. 5 illustrates simulation results regarding the employment of the sensor array;

DETAILED DESCRIPTION

Figure 1A:
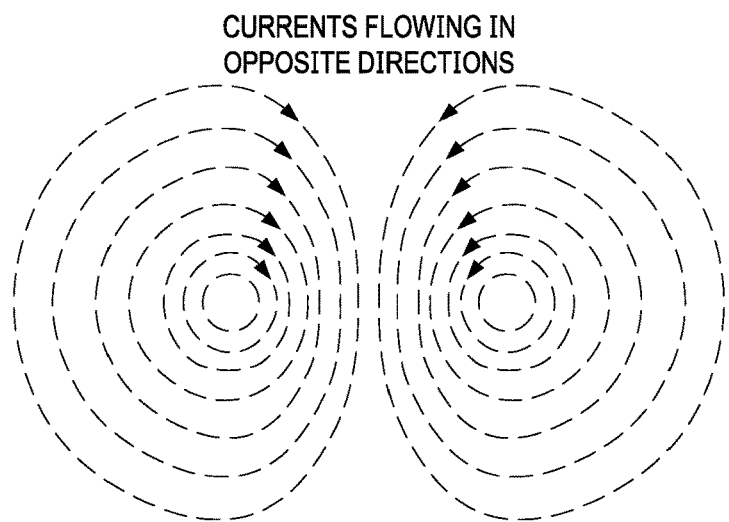
FIG. 1A illustrates a prior art approach of measuring a magnetic field with an Flux Gate sensor.
Figure 1B:
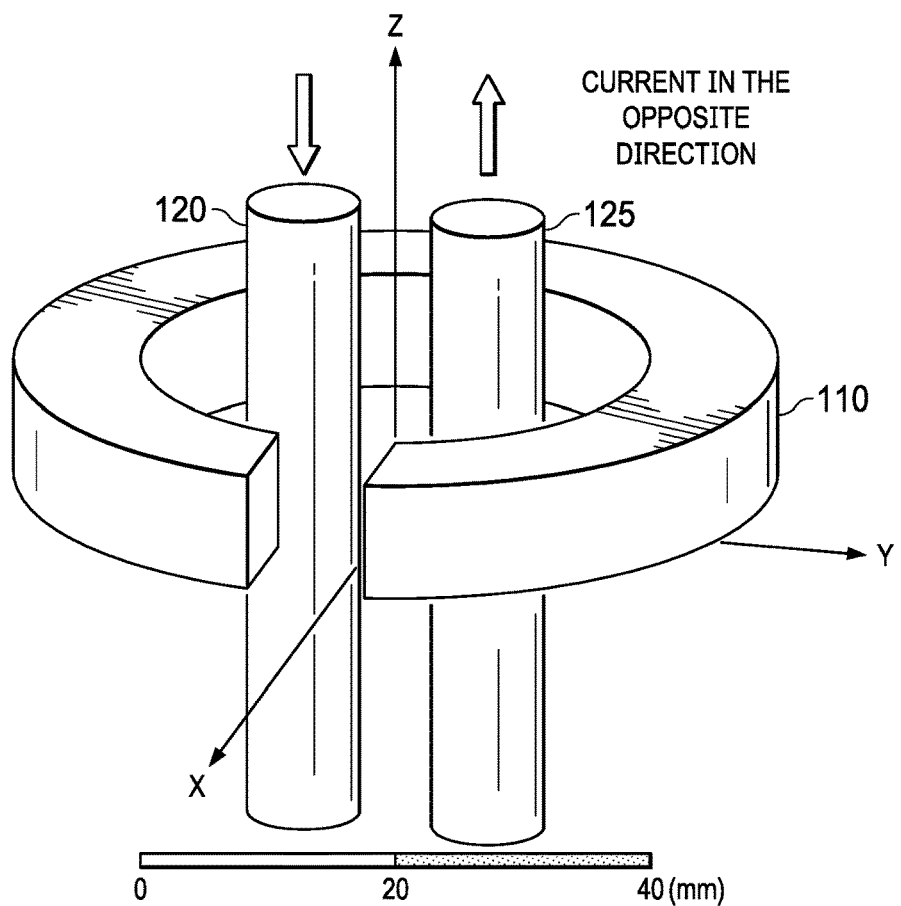
FIG. 1B illustrates a prior art fluxgate sensor and concentrator.
Figure 1C:
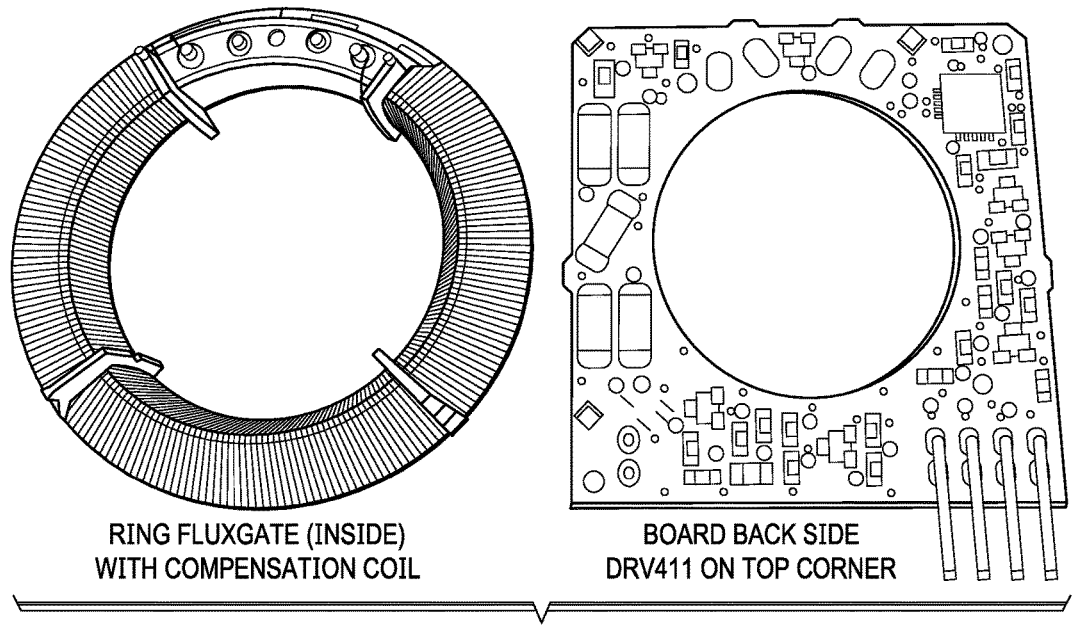
FIG. 1C illustrates a prior art current sensor module.
Figure 2A:
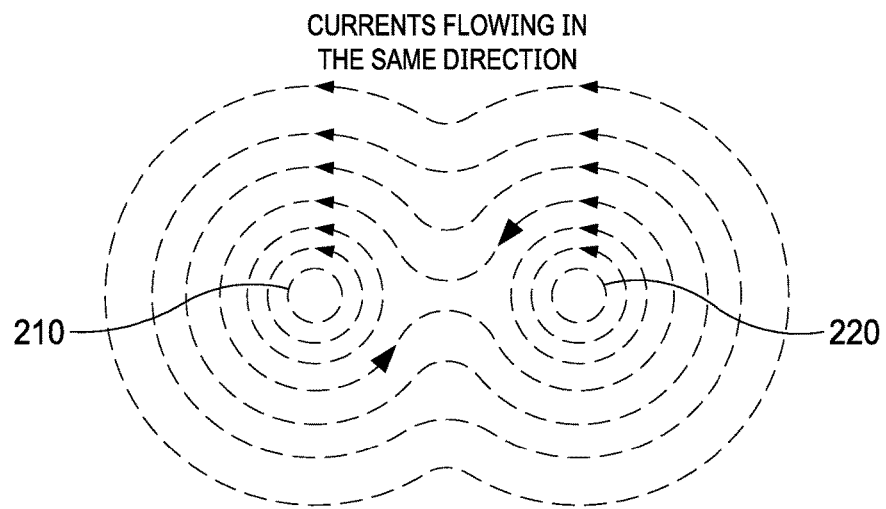
FIG. 2A illustrates one aspect of a principle of operation of the present disclosure.

Turning to FIG. 2A, illustrated is one aspect of a principle of operation of the present disclosure. FIG. 2A illustrates how current flows in a same direction, and how it affects its corresponding magnetic fields. The magnetic field at the center of the 2 conductors carrying current in the same direction is small (zero if the currents in the 2 conductors is of the same magnitude)

As appreciated by the present inventor, there are drawbacks of the prior art approaches. The problems can be common mode rejection, and position sensitivity rejection. The assembly is complex and expensive to manufacture, prior art require accurate summation of fields around the 2 conductors (larger area) for accurate current measurement.

As also appreciated by the present inventor, instead of relying upon a magnetic concentrator around the 2 conductors to concentrate the almost but not quite cancelled out magnetic fields, and ignoring the magnetic field between the conductors, instead one are an array uses an array of very small magnetic field sensors are used between conductors having current flowing in a same direction, thereby allowing the fields in-between the 2 conductors to add, but to almost but not quite neutralize the field between the conductors to be substantially zero, or very close to zero, wherein that value of measurement is proportional to the leakage current, as opposed to a summation of the magnetic field around the conductors, as in the prior art.

Generally, if current is not the same in both of the conductors, then the "zero" point in between the two conductors is shifted, which itself can be detected. In other words, a field between the two conductors 210, 220 with current flowing in a same direction is either zero or small. This small range of magnetic fields is compatible with small sensors, such as any integrated magnetic sensors.

Figure 2B:
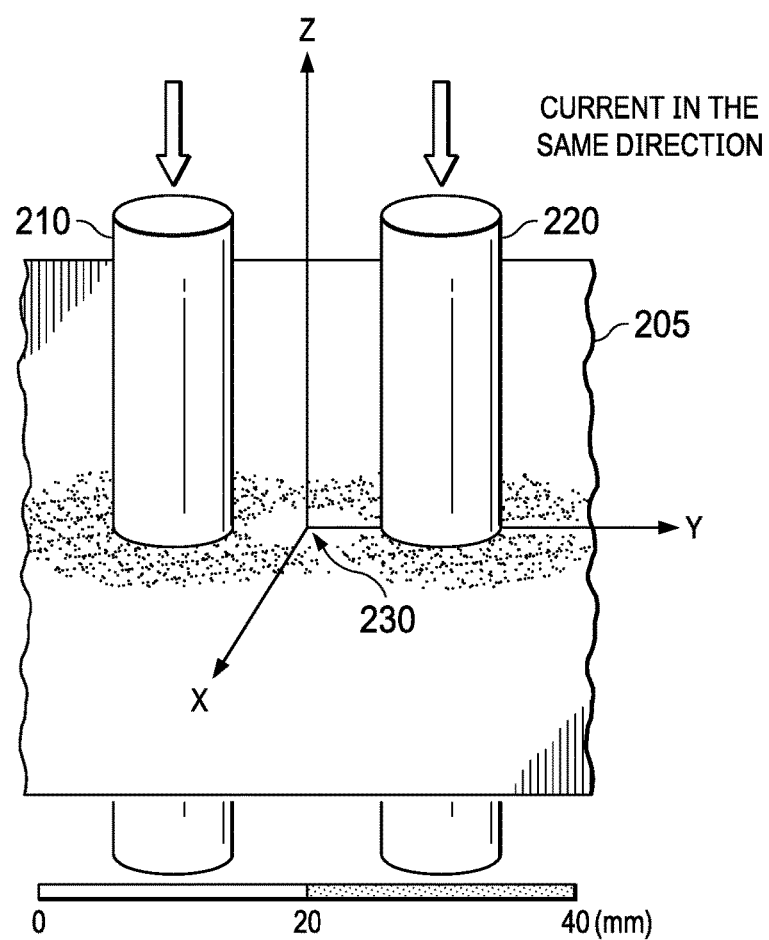
FIG. 2B illustrates a hypothetical resultant magnetic field.

FIG. 2B illustrates the above in more detail, with a hypothetical resultant magnetic field 205. The current is shown as flowing in the same direction, which results in a null or near null spot that is measured by an array of sensors at or around 230. The magnitude of this magnetic field can be very small, such as few micro Tesla, which can be measured by any sensitive sensors.

FIG. 2C illustrates a block diagram of a current sensor using an integrated sensor array 230.

This sensor array such as above is incorporated in such a way that measures the current between a conductor 210 and 220, wherein the current flows in the same direction, due to current sources 201 and 203, respectively. The sensor array 230 then outputs its signals to a processor 240, which is then read at an input/output device (I/O) 250.

Any magnetic field sensor which can be made small on a chip/package (multiple sensor array's on a chip/package) can be used to detect this fault current detection. The chip/package is placed between the 2 conductors, can also be fixed on a PCB board by placing the chip/package in-between 2 current carrying traces. Chip/package needs at-least 4 magnetic sensors (can be based on Integrated HALL, Fluxgate, AMR or GMR sensors) in an array sensing magnetic fields at-least at 4 points.

FIG. 2Di includes an overview of the two approaches of the principles of the present application, and of the Prior Art.

FIG. 2Dii discusses further aspects of two approaches of the principles of the present application, and of the Prior Art.

FIG. 3 illustrates another aspect of sensor array 310 that is used to measure current with conductors 320, 330. Please note that the conductors 320, 330 are not parallel with one another, yet the sensor array 310 can still measure and compensate for this lack of parallelism. The current in the conductors 320, 330 is flowing in the same direction as shown in the figure from top to bottom. In the illustrated aspect, the sensor array has two plus and minus ports, each of which are used to measure the resulting magnetic field. The resulting magnetic fields at Plus points is magnetic field lines coming out of the sheet, whereas at the Minus points is magnetic lines going into the sheet (based on Right hand thumb rule). There are 2 points on 7D line and 2 points on a 6D line.

Figure 4:
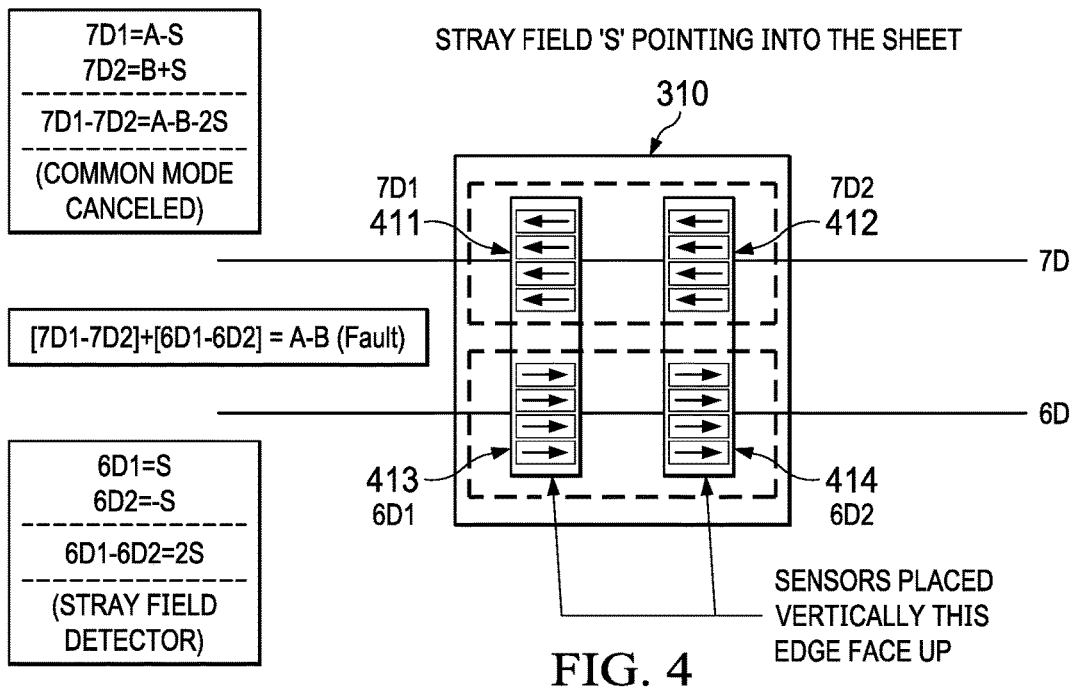
FIG. 4 illustrates a proposed calculations employed with FIG. 3.

FIG. 4 illustrates a proposed calculations employed with FIG. 3. There are a plurality of sensor arrays 411 to 414. The point 7D1 is 411, 7D2 is 412, 6D1 is 413 and 6D2 is 414, these 4 points 411 to 414 are located in a quadrant. The 2 current carrying conductors are placed in such a way that, the field generated by them is seen mainly by 7D1 and 7D2 points. The 2 conductors go away from 6D1 and 6D2 points so that the field measured by them is smaller or negligible. These 4 sensors (sensitivity) are placed in such a way that the reading of any 2 adjacent sensors when added gives zero reading value for the stray field (S). If the field generated by 2 current carrying conductors is A at point 7D1 and B at point 7D2 then the fault current would be A−B (if A−B=0 then there is no fault), if the value of A−B is more than zero above a certain value then it is a fault condition. So by combining all the reading from the 4 points by the equation [7D1−7D2]+[6D1−6D2] gives A−B (Fault) only whereas the stray field 'S' is completely eliminated as shown in FIG. 4.

FIG. 5 illustrates simulation results regarding the employment of the sensor array having a plurality of arrays 411, 412, 413 and 414 (FIG. 4) of sensors. The figure shows 2 conductors one with current I and other with current I+Fault. The table shows the simulation results (including the arithmetic calculation of fields at all 4 points) in Maxwell 3D showing different fault currents in different columns and current I in different rows. According to this result it is possible to sense fault currents greater than 10 mA which is creating a magnetic field of 1 uT per every 10 mA of fault current.

Figure 6:
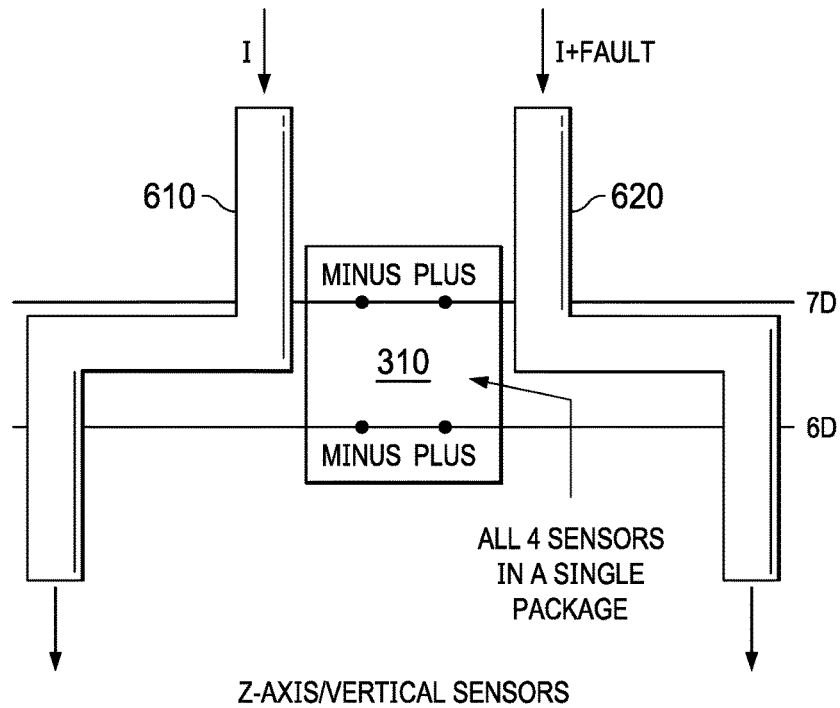
FIG. 6 illustrates an L shaped first and second conductor 610, 620 in proximity the Magnetic Sensor Array chip 310.

FIG. 6 illustrates an L shaped first and second conductor 610, 620 in proximity the Magnetic Sensor Array chip 310. This demonstrates that an L shaped conductor can be used with this sensor; this L shaped conductor placement gives larger signal sensitivity to fault current and much simpler rejection to stray field signals. As the conductors go away from the sensors on the 6D line, they are more sensitive to stray fields than the field created by the conductors. Please note that these are both in the same plane as the sensor.

Figure 7:
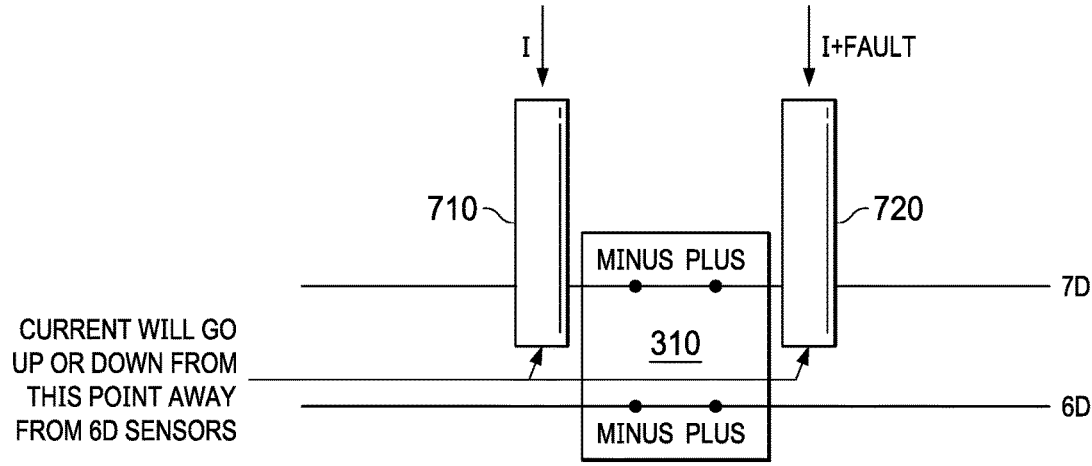
FIG. 7 illustrates two L shaped conductors 710, 720 carrying current in a same direction.

FIG. 7 illustrates two L shaped conductors 710, 720 carrying current in a same direction. In this aspect, the conductors run both parallel to and perpendicular to the magnetic field sensor array chip 310.

Figure 8:
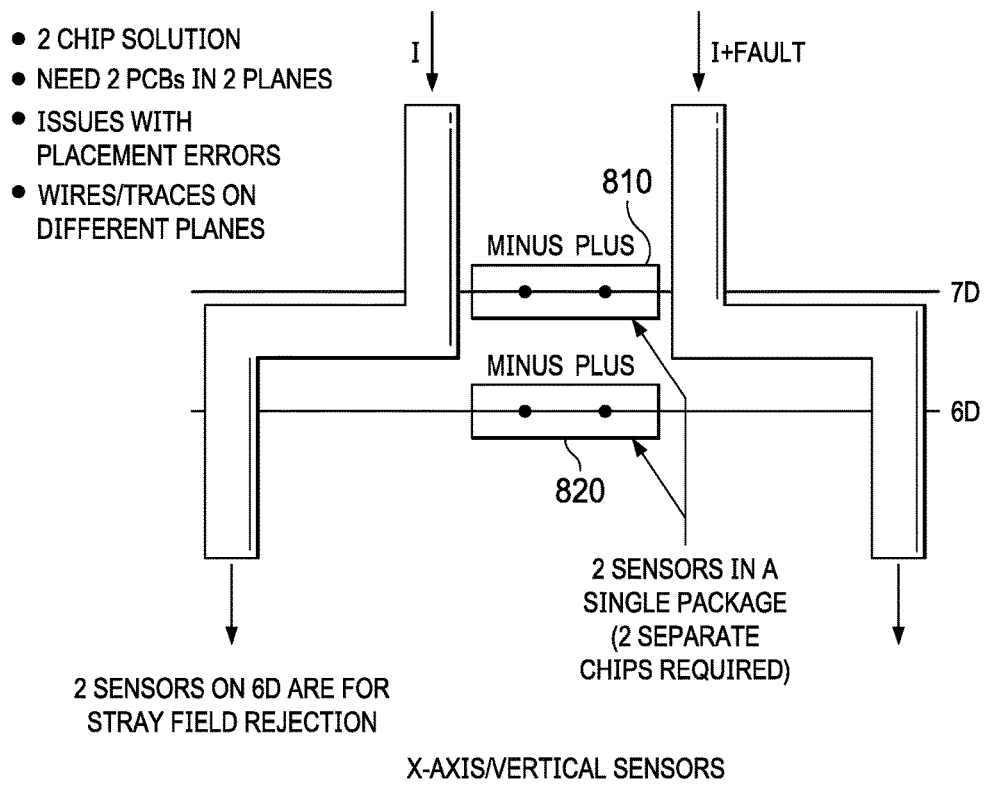
FIG. 8 illustrates that multiple sensor chips 810, 820 each with only 2 sensor arrays can be used in a sensing direction for the same current of opposite shaped staggered features.

FIG. 8 illustrates that multiple sensor chips 810, 820 each with only 2 sensor arrays can be used in a sensing direction for the same current of opposite shaped staggered features, such as employed in FIG. 6.

Those skilled in the art to which this application relates will appreciate that other and further additions, deletions, substitutions and modifications may be made to the described embodiments.

What is claimed is:

1. A system, comprising:
   a magnetic field sensor comprising at least two sets of sensors, the first set of sensors comprising a first sensor and a second sensor, and the second set of sensors comprising a third sensor and a fourth sensor;
   a first conductor proximate to the magnetic field sensor, the first conductor positioned closer to the first set of sensors relative to the second set of sensors, the first conductor for carrying a first current in a first direction; and
   a second conductor proximate to the magnetic field sensor, the second conductor positioned closer to the second set of sensors relative to the first set of sensors, the second conductor for carrying a second current in the first direction, wherein the first and second conductors are positioned in a plane; and the sensors being located between the first and second conductors.

2. The system of claim 1, wherein the magnetic field sensor is positioned substantially between the first conductor and the second conductor.

3. The system of claim 1, wherein the first and second conductors are metallic traces on a printed circuit board.

4. The system of claim 1, wherein the first conductor and the second conductor are parallel to one another.

5. The system of claim 1, wherein the first conductor and the second conductor are not parallel to one another.

6. The system of claim 1, wherein the at least two sets of sensors are positioned in a direction perpendicular to the plane.

7. The system of claim 1, wherein the at least two sets of sensors are positioned in the plane.

8. The system of claim 1, wherein the first set of sensors comprise the first sensor and the third sensor, and the second set of sensors comprise the second sensor and the fourth sensor.

9. The system of claim 8, wherein the first set of sensors is positioned in a plane different from that of the second set of sensors.

10. The system of claim 8, wherein a distance between the first conductor and the first set of sensors is same as a distance between the first conductor and the second set of sensors.

11. The system of claim 8, wherein a distance between the first conductor and the first set of sensors is different from a distance between the first conductor and the second set of sensors.

12. The system of claim 11, wherein the distance between the first conductor and the first set of sensors is smaller than the distance between the first conductor and the second set of sensors.

13. The system of claim 1, wherein each of the first conductor and the second conductor includes an L shape conductor wherein the first and second current are distinct.

14. The system of claim 13, wherein the plane in which the L shape conductor is positioned is perpendicular to a direction of positioning of the at least two sets of sensors.

15. The system of claim 13, wherein each of the first conductor and the second conductor is positioned in two planes, and wherein a first portion of the L shape conductor is positioned in a first plane perpendicular to a direction of positioning of the at least two sets of sensors and a second portion of the L shape conductor is positioned in a second plane parallel to the direction of positioning of the at least two sets of sensors.

16. The system of claim 1, wherein the first conductor and the second conductor are mirror images of one another.

17. The system of claim 1, wherein the magnetic field sensor is an integrated circuit.

18. The system of claim 1 further comprising:
a processor coupled to the magnetic field sensor.

19. A system, comprising:
a magnetic field sensor comprising at least two sets of sensors, the first set of sensors comprising a first sensor and a second sensor, and the second set of sensors comprising a third sensor and a fourth sensor;
a first conductor proximate to the magnetic field sensor, the first conductor positioned closer to the first set of sensors relative to the second set of sensors, the first conductor for carrying a first current in a first direction; and
a second conductor proximate to the magnetic field sensor, the second conductor positioned closer to the second set of sensors relative to the first set of sensors, the second conductor for carrying a second current in the first direction, the first and second currents being distinct, wherein the first and second conductors are positioned in a plane; and
a printed circuit board coupled to the magnetic field sensor, the printed circuit board comprising the first conductor and the second conductor as metallic traces.

20. A system, comprising:
a magnetic field sensor comprising at least two sets of sensors, the first set of sensors comprising a first sensor and a second sensor, and the second set of sensors comprising a third sensor and a fourth sensor;
a first conductor proximate to the magnetic field sensor, the first conductor positioned closer to the first set of sensors relative to the second set of sensors, the first conductor for carrying a first current in a first direction; and
a second conductor proximate to the magnetic field sensor, the second conductor positioned closer to the second set of sensors relative to the first set of sensors, the second conductor for carrying a second current in the first direction, wherein the first and second conductors are positioned in a plane; and
wherein each of the first conductor and the second conductor includes an L shape conductor, the first and second currents are distinct, and wherein a distance between the first conductor and the first sensor is different from a distance between the first conductor and the second sensor.

* * * * *